US 6,524,717 B1

(12) United States Patent
Takano et al.

(10) Patent No.: US 6,524,717 B1
(45) Date of Patent: Feb. 25, 2003

(54) PREPREG, METAL-CLAD LAMINATE, AND PRINTED CIRCUIT BOARD OBTAINED FROM THESE

(75) Inventors: Nozomu Takano, Yuki (JP); Tomio Fukuda, Shimodate (JP); Masato Miyatake, Shimodate (JP); Masahisa Ose, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/913,726

(22) PCT Filed: Feb. 17, 2000

(86) PCT No.: PCT/JP00/00891

§ 371 (c)(1),
(2), (4) Date: Aug. 17, 2001

(87) PCT Pub. No.: WO00/49070

PCT Pub. Date: Aug. 24, 2000

(30) Foreign Application Priority Data

Feb. 19, 1999 (JP) ............................................... 11-40754

(51) Int. Cl.$^7$ ......................... B32B 15/08; B32B 25/20; C08R 9/06
(52) U.S. Cl. ...................... 428/450; 428/447; 428/448; 524/588; 523/206; 523/207; 523/209; 523/212
(58) Field of Search ................................ 428/447, 448, 428/450; 524/588; 523/206, 207, 209, 212

(56) References Cited

U.S. PATENT DOCUMENTS

| | | | |
|---|---|---|---|
| 5,077,115 A | | 12/1991 | Arthur et al. |
| 5,182,173 A | | 1/1993 | Swei |
| 5,223,568 A | * | 6/1993 | Landi et al. ............ 264/331.13 |
| 5,569,684 A | * | 10/1996 | Okami et al. ................ 523/209 |
| 5,612,399 A | * | 3/1997 | Beckley et al. ............. 428/447 |
| 5,641,997 A | * | 6/1997 | Ohta et al. ................... 257/788 |
| 5,677,045 A | * | 10/1997 | Nagai et al. ................. 174/148 |
| 5,753,358 A | * | 5/1998 | Korleski .................. 428/304.4 |
| 6,197,149 B1 | * | 3/2001 | Kobayashi et al. ......... 156/230 |

FOREIGN PATENT DOCUMENTS

| | | | |
|---|---|---|---|
| EP | 0 707 038 A1 | 4/1996 | |
| EP | 0837090 A1 | * 4/1998 | .............. C08J/5/24 |
| JP | 1-204953 | 8/1989 | |

OTHER PUBLICATIONS

Supplementary European Search Report for EP00903999 (completed Jul. 26, 2002).

* cited by examiner

*Primary Examiner*—Robert Dawson
*Assistant Examiner*—Jeffrey B. Robertson
(74) *Attorney, Agent, or Firm*—Antonelli, Terry, Stout & Kraus, LLP

(57) ABSTRACT

This invention relates to a prepreg which comprises a substrate and a resin composition containing a resin, an inorganic filler in an amount of 25% by volume based on the total volume of a solid component of the resin composition and a silicone polymer, which resin composition being impregnated into the substrate, and to a metal-clad-laminated board which comprises at least one metal foil being laminated on both surfaces or one surface of the prepreg mentioned above, or a laminated board of the prepregs under heating and pressure.

25 Claims, No Drawings

PREPREG, METAL-CLAD LAMINATE, AND PRINTED CIRCUIT BOARD OBTAINED FROM THESE

TECHNICAL FIELD

This invention relates to a prepreg, a metal-clad laminated board and a printed wiring board using these.

BACKGROUND ART

Accompanying with spread of electronic equipment for information terminals such as a personal computer or a cellular telephone, a printed wiring board to be mounted thereon becomes a small size and high density. A form of practically mounting a printed wiring board on an electronic part has progressed from a conventional pin insertion type to a surface mounting type, and in recent years, to an area array type represented by BGA (ball grid array) using a plastic substrate. Of these, in a substrate in which a bare chip is directly mounted as in BGA, it is general to carry out bonding between the chip and the substrate by thermal pressure wire bonding with ultrasonic wave. Thus, a substrate to which a bare chip is mounted is exposed to a high temperature of 150° C. or higher so that it is required to have a predetermined surface hardness at the time of pressure bonding. Moreover, accompanying with high speed processing, an I/O number of MPU (microprocessing unit) is increased whereby a number of terminals to be connected by wire bonding is increased and a width of the terminals becomes narrower. That is, it is required to effect wire bonding connection to an extremely small terminal within a shorter period of time than before so that excellent characteristics which can comply with high speed wire bonding are required for the laminated board to be used therefor. As characteristics of the laminated board to comply with high speed wire bonding, there may be mentioned an excellent surface hardness at high temperatures and an excellent surface smoothness of a substrate containing connecting terminals which are becoming narrower.

As a method of improving surface hardness at high temperatures, there has widely been carried out to improve resin properties by increasing a glass transition temperature (Tg) of a resin, etc. (Japanese Provisional Patent Publication No. 312316/1988). However, there is a limit in the method of raising Tg by making cross-linking density high, and decrease of the surface hardness at the temperature region at Tg or higher is extremely large, whereby it is difficult to comply with a high speed wire bonding which is becoming more severer in the future. Moreover, a resin having a high Tg is generally bulky with a high degree in a resin skeleton, and a shrinkage amount is large due to curing or cooling. Thus, if such a material is employed for a laminated board, unevenness is likely caused at the substrate surface whereby causing the problem of increasing surface roughness.

As a method for improving surface hardness and surface smoothness simultaneously, there is a method of changing woven fabric to be used in a substrate of a metal-clad laminated board. A woven fabric having high modulus of elasticity is effective for improvement of surface hardness, while it is effective to make the state of weave pattern of the woven fabric flatten for improvement of surface smoothness. However, only by the method of changing the woven fabric, it is difficult to improve the surface hardness and the surface smoothness to predetermined levels or more. On the other hand, there is a method of formulating an inorganic filler in the resin composition (Japanese Patent Publication No. 45348/1990). For improving the surface hardness and the surface smoothness according to this method, it is necessary to formulate a predetermined amount or more of an inorganic filler. However, if an amount of the inorganic filler in a resin composition is increased, aggregation of the inorganic filler itself and increase in viscosity of the resin composition occur. In a metal-clad laminated board prepared by impregnating a resin into a substrate and then heating and pressurizing, microvoids or portion to which no resin is impregnated frequently appear whereby causing the problem that heat resistance or insulating property of the metal-clad laminated board is markedly deteriorated thereby.

An object of the present invention is to solve the problems involved in the prior art technique, and to provide a prepreg, a metal-clad laminated board and a printed wiring board using these, which can be applied to a high speed wire bonding, is high in surface hardness at high temperatures and excellent in surface smoothness.

SUMMARY OF THE INVENTION

The present invention relates to a prepreg comprising a substrate and a resin composition containing a resin, an inorganic filler in an amount of 25% by volume based on the total volume of a solid component of the resin composition and a silicone polymer, which resin composition being impregnated into the substrate. A preferred prepreg can be obtained when the inorganic filler has previously been subjected to surface treatment by a silicone polymer or a silicone polymer and a coupling agent. It is more preferred when the resin composition further contains a coupling agent, and a resin composition is such that a resin is formulated in a silicone polymer liquor in which the inorganic filler is dispersed or in a solution containing silicone polymer and a coupling agent. Further, in the present invention, a preferred prepreg can be obtained when the silicone polymer is a three-dimensionally cross-linked polymer; and when the silicone polymer contains in its molecule at least one of a tri-functional siloxane unit represented by the formula: $R^1SiO_{3/2}$ (wherein $R^1$ represents the same or different organic group) or a tetra-functional siloxane unit represented by the formula: $SiO_{4/2}$; when the silicone polymer contains 15 to 100 mol % of at least one of a tetra-functional siloxane unit and a tri-functional siloxane unit in the molecule based on the total siloxane units, and 0 to 85 mol % of a bi-functional siloxane unit; or when the silicone polymer contains 15 to 100 mol % of a tetra-functional siloxane unit, 0 to 85 mol % of a tri-functional siloxane unit, and 0 to 85 mol % of a bi-functional siloxane unit in the molecule based on the total siloxane units. Moreover, the present invention relates to a metal-clad-laminated board which can be obtained by laminating at least one metal foil on both surfaces or one surface of this prepreg under heating and pressure; a metal-clad-laminated board wherein a surface hardness of the metal-clad-laminated board at a portion containing no metal foil is 30 or more at 200° C. in terms of a Barcol hardness; and a printed wiring board obtained by subjecting the metal-clad-laminating board as mentioned above to circuit processing.

BEST MODE FOR CARRYING OUT THE INVENTION

A kind of the resin to be used in the present invention is not specifically limited, and the resin may preferably include a thermosetting resin and also a thermoplastic resin enriched in heat resistance. Examples of such resins may include an epoxy resin, a polyimide resin, a phenol resin, a melamine resin, a triazine resin, a modified resin of the above-mentioned resins, and the like, and they may be used in combination of two or more kinds. Also, these resins may be dissolved in various kinds of solvents to form a solution and used, if necessary. As a solvent, there may be mentioned, for example, an alcohol type solvent, an ether type solvent, a ketone type solvent, an amide type solvent, an aromatic hydro-carbon type solvent, an ester type solvent, a nitrile type solvent, and the like, and they may be used in admixture of two or more kinds of the solvents. Moreover, various kinds of curing agents, accelerators and the like may be formulated in the resin, if necessary.

As the curing agents, various known curing agents can be used. When an epoxy resin is used, there may be mentioned, for example, an amine compound such as dicyanediamide, diaminodiphenyl methane, diaminodiphenyl sulfone, etc.; an acid anhydride compound such as phthalic anhydride, pyromellitic anhydride, etc.; a polyfunctional phenol compound such as a phenol novolak resin, a cresol novolak resin, etc. These curing agents may be used in combination of two or more kinds. Also, when a polyimide resin or a triazine resin is used, it is usual to use a curing agent such as an amine compound, etc. as in the case of the epoxy resin, but the invention is not limited thereto. A formulation amount of the curing agent is not particularly limited, and it is preferably formulated in an amount of 0.5 to 1.5 equivalent amount based on the functional group of the main component resin such as the epoxy resin, etc. A kind of the accelerator is not particularly limited. There may be used, for example, an imidazole type compound, an organic phosphorous type compound, a secondary amine, a tertiary amine, a quaternary ammonium salt, etc., and these accelerators may be used in combination of two or more kinds. A formulation amount of the accelerator is also not particularly limited, and it is preferably formulated in an amount of 0.01 to 10.0 parts by weight based on 100 parts by weight of the main component resin.

Among the above-mentioned imidazole type compounds, as the imidazole compound, there may be mentioned, for example, imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, 2-phenyl-4-methylimidazoline, etc. These compounds may be masked by a masking agent. As the masking agent, there may be mentioned, for example, acrylonitrile, phenylenediisocyanate, toluidineisocyanate, naphthalenediisocyanate, methylenebisphenylisocyanate, melamine acrylate, etc.

As the above-mentioned organic phosphorous type compound, there may be mentioned triphenylphosphine, etc.;

the secondary amine may include piperidine, etc.; the tertiary amine may include dimethylbenzylamine, tris-(dimethylaminomethyl)phenol, etc.; and the quaternary ammonium salt may include tetrabutyl ammonium bromide, tetrabutyl ammonium chloride, etc.

In the present invention, 25% by volume or more of an inorganic filler is used based on the total volume of the solid component of the resin composition for the purpose of improvement in surface hardness at high temperatures and surface smoothness. A kind of the inorganic filler is not particularly limited. There may be mentioned, for example, calcium carbonate, alumina, titanium oxide, mica, aluminum carbonate, aluminum hydroxide, magnesium silicate, aluminum silicate, calcined clay, talc, silica, glass short fiber, and whisker such as aluminum borate whisker, silicon carbide whisker, etc., and these inorganic fillers may be used in combination of two or more kinds. Also, a formulation amount of the inorganic filler is preferably 25% by volume or more based on the total volume of the solid component of the resin composition. A surface hardness of a laminated board at the portion containing no metal foil is preferably 30 or more in terms of a Barcol hardness at 200° C., and to comply with a required surface roughness simultaneously, a formulation amount of the inorganic filler is preferably 25 to 65% by volume based on the total volume of the solid component of the resin composition.

Incidentally, a formulation amount regulated by a volume % of the inorganic filler can be measured by various methods, and generally it is measured by obtaining a ratio of a weight of the solid component of a resin composition containing an inorganic filler and a weight of the inorganic filler remained after subjecting the resin composition to heat treatment at 400 to 700° C. for several hours, and these values are converted into volumes from a specific gravity of the resin composition containing no inorganic filler and that of the inorganic filler to obtain a result.

In the present invention, a silicone polymer is used to improve dispersibility of the inorganic filler in the resin composition. The inorganic filler is preferably subjected to surface treatment by the silicone polymer. The silicone polymer may be directly added to the resin composition containing the inorganic filler, whereby the effect of the surface treatment of the inorganic filler by the silicone polymer can be obtained.

The inorganic filler is preferably subjected to surface treatment by the silicone polymer before it is formulated into the resin composition. For the purpose of subjecting the inorganic filler to surface treatment, the inorganic filler is directly added to a solution of the silicone polymer. It is most preferred to formulate the solution of the silicone polymer to which the inorganic filler is added with the other resin material to prepare a resin composition for producing a prepreg. In the above procedure, a temperature at the time of mixing is not particularly limited, and preferably from a normal temperature to 200° C. or lower, more preferably 150° C. or lower.

It is also possible to prepare a resin composition by formulating the inorganic filler into the solution of the silicone polymer, then, separating the inorganic filler the surface of which is coated by the silicone polymer and drying to prepare an inorganic filler subjected to surface treatment by the silicone polymer, and mixing the resulting inorganic filler with the other resin material. A drying temperature at this time is preferably 50 to 200° C., more preferably 80 to 150° C. Also, a drying time is preferably 5 to 60 minutes, more preferably 10 to 30 minutes.

The silicone polymer is preferably used in an amount of 0.01 to 10% by weight, more preferably 0.05 to 5% by weight based on the amount of the inorganic filler.

The silicone polymer to be used in the present invention preferably contains at least one siloxane unit selected from a tri-functional siloxane unit: $R^1SiO_{3/2}$ (wherein $R^1$ represents a same or different organic group) or a tetra-functional siloxane unit represented by the formula: $SiO_{4/2}$ in the molecule, and the polymerization degree is preferably 2 to 7000. A lower limit of the more preferred polymerization degree is 3, and further preferred polymerization degree is 5 to 5000, particularly preferably 10 to 100. Here, the term "polymerization degree" means, when it is a polymer of a low polymerization degree, a molecular weight of the polymer and when it is a polymer of a high polymerization degree, that calculated from a number average molecular weight measured by using a calibration curve of standard polystyrenes or polyethylene glycols obtained by gel permeation chromatography.

As the siloxane unit, in addition to one or more of the tri-functional and tetra-functional ones, a bi-functional siloxane unit of the formula: $R^2{}_2SiO_{2/2}$ (wherein $R^2$ represents an organic group, and $R^2$ groups in the silicone polymer may be the same or different from each other) may be contained in an amount of 0 to 85 mol % based on the total unit numbers.

The above-mentioned organic groups $R^1$ and $R^2$ may be mentioned, for example, an alkyl group having 1 to 4 carbon atoms, a phenyl group, etc., and as the functional group which reacts with a hydroxyl group, there may be mentioned, for example, a silanol group, an alkoxy group having 1 to 4 carbon atoms, an acyloxy group having 2 to 5 carbon atoms, a halogen atom such as chlorine, bromine, etc.

The silicone polymer in the present invention is a three-dimensionally cross-linked polymer. For example, preferred are those comprising only a tri-functional siloxane unit; only a tetra-functional siloxane unit; a bi-functional siloxane unit and a tri-functional siloxane unit; a bi-functional siloxane unit and a tetra-functional siloxane unit; a tri-functional siloxane unit and a tetra-functional siloxane unit; and a bi-functional siloxane unit, a tri-functional siloxane unit and a tetra-functional siloxane unit.

Specific amounts of these units to be contained are preferably 15 to 100 mol % of at least one of the tetra-functional siloxane unit and the tri-functional siloxane unit and 0 to 85 mol % of the bi-functional siloxane unit; more preferably 20 to 100 mol % of at least one of the tetra-functional siloxane unit and the tri-functional siloxane unit and 0 to 80 mol % of the bi-functional siloxane unit, based on the total siloxane units.

In particular, it is further preferred that the silicone polymer contains 15 to 100 mol % of the tetra-functional siloxane unit, 0 to 85 mol % of the tri-functional siloxane unit and 0 to 85 mol % of the bi-functional siloxane unit; particularly preferably 20 to 100 mol % of the tetra-functional siloxane unit, 0 to 80 mol % of the tri-functional siloxane unit and 0 to 80 mol % of the bi-functional siloxane unit, based on the total siloxane units.

The silicone polymer to be used in the present invention can be obtained by hydrolyzing a silane compound represented by the formula (I):

$$R^4{}_nSiX_{4-n} \quad (I)$$

wherein X represents a halogen atom such as chlorine and bromine or —$OR^3$ where $R^3$ represents an alkylcarbonyl group having an alkyl group with 1 to 4 carbon atoms; $R^4$ represents an alkyl group having 1 to 4 carbon atoms, an aryl group such as a phenyl group, etc.; and n is an integer of 0 to 2, and then, subjecting to polycondensation.

As the silane compounds represented by the above formula (I), there may be mentioned, more specifically, a tetra-functional silane compound (hereinafter the functionality in the silane compound means to have a functional group which is reactive for condensation) including
a tetraalkoxysilane such as $Si(OCH_3)_4$, $Si(OC_2H_5)_4$, $Si(OC_3H_7)_4$, $Si(OC_4H_9)_4$, etc.;

a tri-functional silane compound such as a monoalkyltrialkoxysilane such as $H_3CSi(OCH_3)_3$, $H_5C_2Si(OCH_3)_3$, $H_7C_3Si(OCH_3)_3$, $H_9C_4Si(OCH_3)_3$, $H_3CSi(OC_2H_5)_3$, $H_5C_2Si(OC_2H_5)_3$, $H_7C_3Si(OC_2H_5)_3$, $H_9C_4Si(OC_2H_5)_3$, $H_3CSi(OC_3H_7)_3$, $H_5C_2Si(OC_3H_7)_3$, $H_7C_3Si(OC_3H_7)_3$, $H_9C_4Si(OC_3H_7)_3$, $H_3CSi(OC_4H_9)_3$, $H_5C_2Si(OC_4H_9)_3$, $H_7C_3Si(OC_4H_9)_3$, $H_9C_4Si(OC_4H_9)_3$, etc.;

a phenyltrialkoxysilane such as $PhSi(OCH_3)_3$, $PhSi(OC_2H_5)_3$, $PhSi(OC_3H_7)_3$, $PhSi(OC_4H_9)_3$, etc.;

a monoalkyltriacyloxysilane such as $(H_3CCOO)_3SiCH_3$, $(H_3CCOO)_3SiC_2H_5$, $(H_3CCOO)_3SiC_3H_7$, $(H_3CCOO)_3SiC_4H_9$, etc.; and a monoalkyltrihalogenosilane such as $Cl_3SiCH_3$, $Cl_3SiC_2H_5$, $Cl_3SiC_3H_7$, $Cl_3SiC_4H_9$, $Br_3SiCH_3$, $Br_3SiC_2H_5$, $Br_3SiC_3H_7$, $Br_3SiC_4H_9$, etc.; and a bi-functional silane compound including a dialkyldialkoxysilane such as $(H_3C)_2Si(OCH_3)_2$, $(H_5C_2)_2Si(OCH_3)_2$, $(H_7C_3)_2Si(OCH_3)_2$, $(H_9C_4)_2Si(OCH_3)_2$, $(H_3C)_2Si(OC_2H_5)_2$, $(H_5C_2)_2Si(OC_2H_5)_2$, $(H_7C_3)_2Si(OC_2H_5)_2$, $(H_9C_4)_2Si(OC_2H_5)_2$, $(H_3C)_2Si(OC_3H_7)_2$, $(H_5C_2)_2Si(OC_3H_7)_2$, $(H_7C_3)_2Si(OC_3H_7)_2$, $(H_9C_4)_2Si(OC_3H_7)_2$, $(H_3C)_2Si(OC_4H_9)_2$, $(H_5C_2)_2Si(OC_4H_9)_2$, $(H_7C_3)_2Si(OC_4H_9)_2$, $(H_9C_4)_2Si(OC_4H_9)_2$, etc.;

a diphenyldialkoxysilane such as $(Ph)_2Si(OCH_3)_2$, $(Ph)_2Si(OC_2H_5)_2$, etc.;

a dialkyldiacyloxysilane such as $(H_3CCOO)_2Si(OCH_3)_2$, $(H_3CCOO)_2Si(OC_2H_5)_2$, $(H_3CCOO)_2Si(OC_3H_7)_2$, $(H_3CCOO)_2Si(OC_4H_9)_2$, etc.; and a monoalkyltrihalogenosilane such as $Cl_2Si(CH_3)_2$, $Cl_2Si(C_2H_5)_2$, $Cl_2Si(C_3H_7)_2$, $Cl_2Si(C_4H_9)_2$, $Br_2Si(CH_3)_2$, $Br_2Si(C_2H_5)_2$, $Br_2Si(C_3H_7)_2$, $Br_2Si(C_4H_9)_2$, etc.

The silane compound represented by the above-mentioned formula (I) to be used in the present invention contains one or more of the tetra-functional silane compound or the tri-functional silane compound as an essential component, and a bi-functional silane compound may be used optionally depending on necessity. As the tetra-functional silane compound, a tetraalkoxysilane is preferred, as the tri-functional silane compound, a monoalkyltrialkoxysilane is preferred and as the bi-functional silane compound, a dialkyldialkoxysilane is preferred.

An amount of the silane compound to be used is preferably 15 to 100 mol % of at least one of the tetra-functional silane compound and the tri-functional silane compound and 0 to 85 mol % of the bi-functional silane compound, more preferably 20 to 100 mol % of at least one of the tetra-functional silane compound and the tri-functional silane compound and 0 to 80 mol % of the bi-functional silane compound.

In particular, it is further preferred that the silane compound contains 15 to 100 mol % of the tetra-functional silane compound, 0 to 85 mol % of the tri-functional silane compound and 0 to 85 mol % of the bi-functional silane compound; particularly preferably 20 to 100 mol % of the tetra-functional silane compound, 0 to 80 mol % of the tri-functional silane compound and 0 to 80 mol % of the bi-functional silane compound,.

The silicone polymer can be produced by hydrolyzing and polycondensation of the silane compound represented by above-mentioned the formula (I). At this time, a catalyst to be used in these reactions is preferably an inorganic acid such as hydrochloric acid, sulfuric acid, phosphoric acid, nitric acid, hydrofluoric acid, etc.; and an organic acid such as oxalic acid, maleic acid, sulfonic acid, formic acid, acetic acid, etc., and also, a basic catalyst such as ammonia, trimethyl ammonia, etc., may be used. These catalysts are used in an amount suitable for the formulation amount of the silane compound represented by the formula (I), and preferably within the range of 0.001 to 0.5 mol based on 1 mol of the silane compound represented by the formula (I).

Also, the above-mentioned hydrolysis and polycondensation are preferably carried out in a solvent which is used for preparation of a varnish mentioned below, particularly preferably in an alcoholic type solvent, a ketone type solvent, etc.

Moreover, for effecting these reactions, water sometimes exists. An amount of water is also optionally determined, and if an amount of water is too much, a problem arises that storage stability of a coating solution becomes poor so that an amount of water is preferably within the range of 0 to 5 mol, more preferably 0.5 to 4 mol based on 1 mol of the silane compound represented by the formula (I).

Also, these silicone polymer may be used in combination with various kinds of coupling agents. As such a coupling agent, there may be mentioned a silane type coupling agent, a titanate type coupling agent, etc. The silane type coupling agent may generally include an epoxysilane type coupling agent, an aminosilane type coupling agent, a cationic silane type coupling agent, a vinylsilane type coupling agent, an acrylsilane type coupling agent, a mercaptosilane type coupling agent, and a mixture of at least two of the above-mentioned coupling agents.

The coupling agent is preferably used simultaneously with the silicone polymer in the various preparation processes. Also, the coupling agent is preferably used in an amount within the range of 0.01 to 10% by weight, more preferably 0.05 to 5% by weight based on the inorganic filler.

The resin composition containing these resin material and inorganic filler is preferably used by dissolving in a solvent in the form of a varnish. A kind of the solvent to be used at this time is not particularly limited. Examples of such solvents may include an alcoholic type solvent such as methanol, ethanol, etc.; an ether type solvent such as ethylene glycol monomethyl ether, etc.; a ketone type solvent such as acetone, methyl ethyl ketone, methyl isobutyl ketone, etc.; an amide type solvent such as N,N-dimethylformamide, etc.; an aromatic hydro-carbon type solvent such as toluene, xylene, etc.; an ester type solvent such as ethyl acetate, etc.; a nitrile type solvent such as butyronitrile, etc., and the like, and these solvents may be used in combination of two or more. Also, a concentration of the solid component of the varnish is not particularly limited and may be optionally selected depending on the kinds of the resin composition or inorganic filler and formulation amounts thereof, etc. However, if the concentration of the solid component is less than 50% by weight, a viscosity of the varnish is too low so that the resin component of the prepared prepreg tends to be low, while if it exceeds 80% by weight, a viscosity of the varnish becomes high so that appearance of the prepared prepreg becomes poor, whereby it is preferably within the range of 50 to 80% by weight, more preferably 55 to 75% by weight.

A prepreg is prepared by impregnating a varnish of a resin composition containing a resin, an inorganic filler and a silicone polymer into a substrate, and drying the resulting material within the range of 80 to 200° C. The substrate is not particularly limited so long as it is employed for producing a metal-clad laminated board or a multi-layer printed wiring board. A fibrous substrate such as woven fabric or nonwoven fabric may be generally used. A material of the fibrous substrate may be mentioned, for example, an inorganic fiber such as glass, alumina, asbestos, boron, silica alumina glass, silica glass, Tyranno (trade name) fiber, silicon carbide, silicon nitride, zirconia, etc.; an organic fiber such as aramid, polyether ether ketone, polyether imide, polyether sulfone, carbon, cellulose, etc.; or a mixed fabric type fiber of the above-mentioned fibers, and woven fabric made of a glass fiber is particularly preferred. As a substrate to be used for the prepreg, a glass cloth with a thickness of 30 $\mu$m to 200 $\mu$m is particularly suitable.

Preparation conditions of the prepreg are not particularly limited, and preferred are conditions at which 80% by weight or more of the solvent to be used for preparing a varnish is evaporated. Molding method, drying conditions, etc. are not particularly limited, and a drying temperature is preferably 80 to 200° C., and a drying time can be determined depending on a gelation time of the varnish.

An impregnation amount of the varnish into the substrate is preferably set so that a solid component of the varnish to be impregnated into the substrate becomes 35 to 70% by weight based on the total amount of the solid component of the varnish and the substrate.

Preparation methods of an insulating sheet, a laminated board and a metal-clad laminated board are as follows.

A metal foil or metal foils is/are laminated on, depending on necessity, one surface or both surfaces of the prepreg according to the present invention or a laminated board in which a plural number of the prepregs are laminated, and the resulting material is subjected to molding under heating and pressure, generally at a temperature of 130 to 250° C., preferably 150 to 200° C., at a pressure of 0.5 to 20 MPa, preferably 1 to 8 MPa to prepare an insulating sheet, a laminated board or a metal-clad laminated board. By using a metal foil(s) to prepare a metal-clad laminated board, and by subjecting circuit processing to the metal-clad laminated board, a printed circuit board can be prepared.

The metal-clad laminated board preferably has a surface hardness at the portion containing no metal foil, in other words, at the portion except for the portion at which it is made of a metal or a metal foil of 30 or more at 200° C. in terms of the Barcol hardness.

The metal foil to be used in the present invention may generally include a copper foil or an aluminum foil, and a foil having a thickness of 5 to 200 $\mu$m generally used as a laminated board can be used. Also, there may be used a complex foil comprising a three-layered structure in which a copper layer with a thickness of 0.5 to 15 $\mu$m and a copper layer with a thickness of 10 to 300 $\mu$m are provided on the both surfaces of an intermediate layer comprising nickel, nickel-phosphorous, nickel-tin alloy, nickel-iron alloy, lead, lead-tin alloy, etc. or a two-layered structure in which an aluminum foil and a copper foil are laminated.

By using the metal-clad laminated board according to the present invention, circuit-making processing is carried out on the surface of the metal foil or a metal foil etched surface by means of a conventionally known method, a printed wiring board can be produced. Also, a prepreg or prepregs is/are provided on one surface or both surfaces of a wiring board which is to be used as an inner board, then, the resulting material is subjected to press molding, and after subjecting to drilling for interlayer connection, plating, etc., circuit-making processing is carried out on the surface of the resulting material in the same manner as mentioned above to produce a multi-layered printed wiring board.

A circuit-making processing can be carried out by the method conventionally known in the art. For example, the method can be carried out, by using a drill, a necessary through hole(s) is/are formed to the board and plating is applied to the through hole to cause continuity whereby forming a resist pattern, and after removing the plating at an unnecessary portion by etching, the resist pattern is finally removed. On the surface of the thus prepared printed wiring board, a metal-clad laminated board is laminated under the same conditions as mentioned above, and the same circuit-making processing is applied thereto to form a multi-layered printed wiring board. In this case, it is not necessarily required to form a through hole(s) but a via hole(s) may be formed, or else, both of these may be formed. Such a procedure to make a multi-layered board can be carried out by laminating a predetermined number of sheets.

EXAMPLES

In the following, Examples of the present invention will be explained more specifically, but the present invention is not limited by these.

Example 1

In a glass flask equipped with a stirrer, a condenser and a thermometer were charged 40 g of tetramethoxysilane and 93 g of methanol, and then, 0.47 g of acetic acid and 18.9 g of distilled water were charged therein and the mixture was stirred at 50° C. for 8 hours to synthesize a silicone polymer. An average number of siloxane repeating units of the resulting silicone polymer was 20. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler.

The resulting liquid containing a treated inorganic filler was heated to 50° C. and to the liquid were added the resins and compound with formulation amounts mentioned below based on 180 parts by weight of the inorganic filler in the liquid and a solvent of methyl ethyl ketone and ethylene glycol monomethyl ether with a weight ratio of 50:50 to prepare a resin composition varnish with a solid component of 70% by weight. Here, a ratio of the inorganic filler based on the total volume of the solid component of the resin composition was about 37% by volume.

Brominated bisphenol A type epoxy resin 50 parts by weight (available from Sumitomo Kagaku Kogyo K.K., ESB400T, trade name, epoxy equivalent: 400)

Ortho-cresol novolak type epoxy resin 50 parts by weight (available from Sumitomo Kagaku Kogyo K.K., ESCN195, trade name, epoxy equivalent: 195)

Phenol-novolak resin 42 parts by weight (available from Hitachi Chemical Co., Ltd., HP850N, hydroxyl group equivalent: 108)

2-Ethyl-4-methylimidazole 0.5 part by weight

The thus prepared varnish was impregnated into a glass cloth (style 2116, E-glass) with a thickness of about 0.1 mm, heated at 150° C. for 5 minutes and dried to obtain a prepreg with a resin component of 43% by weight. our sheets of these prepregs were laminated and copper foils each having a thickness of 18 μm were overlapped on the both surfaces of the laminate and the resulting material was subjected to press molding at 170° C. for 90 minutes under 4.0 MPa to prepare a both-surfaces copper-clad laminated board.

Example 2

In the same manner as in Example 1, into a solution containing 40 g of trimethoxymethylsilane and 93 g of methanol were formulated 0.53 g of acetic acid and 15.8 g of distilled water, and the resulting mixture was heated at 50° C. for 8 hours to synthesize a silicone polymer. An average number of siloxane repeating units of the resulting silicone polymer was 15. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler. By using the resulting liquid containing a treated inorganic filler, a prepreg and a both-surfaces copper-clad laminated board were prepared in the same manner as in Example 1.

Example 3

In the same manner as in Example 1, into a solution containing 34 g of dimethoxydimethylsilane, 8 g of tetramethoxysilane and 98 g of methanol were formulated 0.60 g of acetic acid and 14.0 g of distilled water, and the resulting mixture was heated at 50° C. for 8 hours to synthesize a silicone polymer. An average number of siloxane repeating units of the resulting silicone polymer was 28. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler. By using the resulting liquid containing a treated inorganic filler, a prepreg and a both-surfaces copper-clad laminated board were prepared in the same manner as in Example 1.

Example 4

In the same manner as in Example 1, into a solution containing 20 g of dimethoxydimethylsilane, 25 g of tetramethoxysilane and 105 g of methanol were formulated 0.60 g of acetic acid and 17.8 g of distilled water, and the resulting mixture was heated at 50° C. for 8 hours to synthesize a silicone polymer. An average number of siloxane repeating units of the resulting silicone polymer was 30. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler. By using the resulting liquid containing a treated inorganic filler, a prepreg and a both-surfaces copper-clad laminated board were prepared in the same manner as in Example 1.

Example 5

In the same manner as in Example 1, into a solution containing 20 g of trimethoxymethylsilane, 22 g of tetramethoxysilane and 98 g of methanol were formulated 0.52 g of acetic acid and 18.3 g of distilled water, and the resulting mixture was heated at 50° C. for 8 hours to synthesize a silicone polymer. An average number of siloxane repeating units of the resulting silicone polymer was 25. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler. By using the resulting liquid containing a treated inorganic filler, a prepreg and a both-surfaces copper-clad laminated board were prepared in the same manner as in Example 1.

Example 6

In the same manner as in Example 1, into a solution containing 10 g of dimethoxydimethylsilane, 10 g of trimethoxymethylsilane, 20 g of tetramethoxysilane and 93 g of methanol were formulated 0.52 g of acetic acid and 16.5 g of distilled water, and the resulting mixture was heated at 50° C. for 8 hours to synthesize a silicone polymer. An average number of siloxane repeating units of the resulting silicone polymer was 23. To the silicone polymer solution was added methyl ethyl ketone to prepare a treating solution with a solid component of 10% by weight. To the treating solution was formulated 1300 g of calcined clay as an inorganic filler and the mixture was stirred at room temperature for one hour to prepare a liquid containing a treated inorganic filler. By using the resulting liquid containing a treated inorganic filler, a prepreg and a both-surfaces copper-clad laminated board were prepared in the same manner as in Example 1.

Example 7

In the same manner as in Example 1 except for formulating 2000 g of calcined clay in place of 1300 g of the same as an inorganic filler, a liquid containing a treated inorganic filler was prepared. By using the resulting liquid containing a treated inorganic filler, a prepreg and a both-surfaces copper-clad laminated board were prepared in the same manner as in Example 1. In this Example, the formulation amounts of the resins and compound based on 200 parts by weight of the inorganic filler in the liquid were as mentioned below. Here, a ratio of the inorganic filler based on the total volume of the solid component of the resin composition was about 40% by volume.

- Brominated bisphenol A type epoxy resin 50 parts by weight (available from Sumitomo Kagaku Kogyo K.K., ESB400T, trade name, epoxy equivalent: 400)
- Ortho-cresol novolak type epoxy resin 50 parts by weight (available from Sumitomo Kagaku Kogyo K.K., ESCN195, trade name; epoxy equivalent: 195)
- Phenol-novolak resin 42 parts by weight (available from Hitachi Chemical Co., Ltd., HP850N, hydroxyl group equivalent: 108)
- 2-Ethyl-4-methylimidazole 0.5 part by weight

Example 8

In the same manner as in Example 1 except for using talc in place of the calcined clay as an inorganic filler, a liquid containing a treated inorganic filler was prepared. By using the resulting liquid containing a treated inorganic filler, a prepreg and a both-surfaces copper-clad laminated board were prepared in the same manner as in Example 1. Here, a ratio of the inorganic filler based on the total volume of the solid component of the resin composition was about 37% by volume.

Example 9

In the same manner as in Example 1 except for using silica in place of the calcined clay as an inorganic filler, a liquid containing a treated inorganic filler was prepared. By using the resulting liquid containing a treated inorganic filler, a prepreg and a both-surfaces copper-clad laminated board were prepared in the same manner as in Example 1. Here, a ratio of the inorganic filler based on the total volume of the solid component of the resin composition was about 31% by volume.

Example 10

To a silicone polymer solution obtained in Example 1 were added γ-glycidoxypropyltrimethoxysilane (trade name: A-187, available from Nippon Unicar Co.) as a silane coupling agent and methyl ethyl ketone to prepare a treating solution having a solid component of 10% by weight. Here, the silicone polymer and A-187 were formulated with a weight ratio of 50:50. To the treating solution was formulated 1300 g of calcined clay as an inorganic filler, and the mixture was stirred at room temperature for one hour to prepare a liquor containing a treated inorganic filler. By using the resulting liquid containing a treated inorganic filler, a prepreg and a both-surfaces copper-clad laminated board were prepared in the same manner as in Example 1.

Example 11

To a silicone polymer solution obtained in Example 4 were added isopropyltris(dioctylpyrophosphate) titanate (trade name: KR46B, available from Ajinomoto K.K., ) as a titanate coupling agent and methyl ethyl ketone to prepare a treating solution having a solid component of 10% by weight. Here, the silicone polymer and KR46B were formulated with a weight ratio of 50:50. To the treating solution was formulated 1300 g of calcined clay as an inorganic filler, and the mixture was stirred at room temperature for one hour to prepare a liquor containing a treated inorganic filler. By using the resulting liquid containing a treated inorganic filler, a prepreg and a both-surfaces copper-clad laminated board were prepared in the same manner as in Example 1.

Example 12

To the resins, compound and inorganic filler shown below were added 2 parts by weight of the silicone polymer solution obtained in Example 1, methyl ethyl ketone and ethylene glycol monomethyl ether to prepare a varnish with a solid component of 70% by weight. The thus prepared varnish was impregnated into a glass cloth (style 2116, E-glass) with a thickness of about 0.1 mm, heated at 150° C. for 5 minutes and dried to obtain a prepreg with a resin component of 43% by weight. Four sheets of these prepregs were laminated and copper foils each having a thickness of 18 μm were overlapped on the both surfaces of the laminate and the resulting material was subjected to press molding at 170° C. for 90 minutes under 4.0 MPa to prepare a both-surfaces copper-clad laminated board.

- Brominated bisphenol A type epoxy resin 50 parts by weight (available from Sumitomo Kagaku Kogyo K.K., ESB400T, trade name, epoxy equivalent: 400)
- Ortho-cresol novolak type epoxy resin 50 parts by weight (available from Sumitomo Kagaku Kogyo K.K., ESCN195, trade name, epoxy equivalent: 195)
- Phenol-novolak resin 42 parts by weight (available from Hitachi Chemical Co., Ltd., HP850N, hydroxyl group equivalent: 108)
- 2-Ethyl-4-methylimidazole 0.5 part by weight
- Calcined clay (about 37% by volume) 180 parts by weight

Example 13

To the resins, compound and inorganic filler shown in Example 12 were added 2 parts by weight of the silicone polymer solution obtained in Example 10, methyl ethyl ketone- and ethylene glycol monomethyl ether to prepare a varnish with a solid component of 70% by weight. By using the thus prepared varnish, a prepreg and a both-surfaces copper-clad laminated board were prepared in the same manner as in Example 12.

Example 14

To the resins, compound and inorganic filler shown in Example 12 were added 2 parts by weight of the silicone polymer solution obtained in Example 11, methyl ethyl ketone and ethylene glycol monomethyl ether to prepare a varnish with a solid component of 70% by weight. By using the thus prepared varnish, a prepreg and a both-surfaces copper-clad laminated board were prepared in the same manner as in Example 12.

Comparative Example 1

By mixing an untreated calcined clay which had not been treated by a treating solution, resins, compound, methyl ethyl ketone and ethylene glycol monomethyl ether with formulation amounts shown below, a varnish with a solid component of 70% by weight was prepared. By using the thus prepared varnish, a prepreg and a both-surfaces copper-clad laminated board were prepared in the same manner as in Example 12.

Brominated bisphenol A type epoxy resin 50 parts by weight (available from Sumitomo Kagaku Kogyo K.K., ESB400T, trade name, epoxy equivalent: 400)

Ortho-cresol novolak type epoxy resin 50 parts by weight (available from Sumitomo Kagaku Kogyo K.K., ESCN195, trade name, epoxy equivalent: 195)

Phenol-novolak resin 42 parts by weight (available from Hitachi Chemical Co., Ltd., HP850N, hydroxyl group equivalent: 108)

2-Ethyl-4-methylimidazole 0.5 part by weight

Calcined clay (about 37% by volume) 180 parts by weight

Comparative Example 2

In the same manner as in Comparative example 1 except for additionally formulating 2 parts by weight of γglycidoxypropyltrimethoxysilane (trade name: A-187, available from Nippon Unicar Co.) as a silane coupling agent, a varnish was prepared as in Comparative example 1. By using the thus prepared varnish, a prepreg and a both-surfaces copper-clad laminated board were prepared in the same manner as in Example 12.

Comparative Example 3

In the same manner as in Example 1 except for using an epoxy-modified silicone oil (trade name: KP101, available from Shin-etsu Kagaku Kogyo K.K.) in place of the silicone polymer, a liquor containing an inorganic filler was prepared. By using the liquor containing an inorganic filler, a prepreg and a both-surfaces copper-clad laminated board were prepared in the same manner as in Example 1.

Comparative Example 4

A treating solution was prepared by using a silane coupling agent (γ-glycidoxypropyltrimethoxysilane (trade name: A-187, available from Nippon Unicar Co.)) and methanol with a solid component of 1% by weight, and an untreated calcined clay was immersed therein and stirred at room temperature for one hour, then, dried at 120° C. for one hour to effect surface treatment. By using the treated calcined clay, a varnish was prepared in the same manner as in Comparative example 1. By using this varnish, a prepreg and a both-surfaces copper-clad laminated board were prepared in the same manner as in Example 12.

Comparative Example 5

In the same manner as in Example 1 except for formulating 100 parts by weight (about 20% by volume based on the total volume of the solid component of the resin composition) in stead of 180 parts by weight of the inorganic filler, a varnish was prepared as in Example 1. By using the thus prepared varnish, a prepreg and a both-surfaces copper-clad laminated board were prepared in the same manner as in Example 12.

Next, by using the both-surfaces copper-clad laminated boards prepared in Examples 1 to 14 and Comparative examples 1 to 5, printed wiring boards were produced by subjecting to circuit-making processing. The circuit-making processing was carried out by forming a necessary through hole(s) to the both-surfaces copper-clad laminated board by a drill, applying plating for making continuity to the through hole(s) and after forming a resist pattern, removing unnecessary copper foil and plating by etching, and finally removing the resist pattern. At this time, a diameter of the hole before applying plating thereto is selected from a diameter of 0.05 mm to 1.0 mm depending on the place. Also, line (L)/space (S) due to pattern formation was optionally selected from L/S=100 μm/100 μm to L/S=25 μm/25 μm and processed.

With regard to the both-surfaces copper-clad laminated boards of Examples 1 to 14 and Comparative examples 1 to 5 thus prepared, surface smoothness, Barcol hardness, wire bonding property, solder heat resistance and migration resistance were evaluated. The results are shown in Table 1.

The test methods are as mentioned below. The surface smoothness at the lateral direction of the both-surfaces copper-clad laminated board was measured by a contact type surface roughness meter, and the surface roughness was shown by $R_{max}$ (maximum height) at the standard length of 8 mm according to JIS B 0601. The Barcol hardness was measured by using a laminated board in which a copper foil had been etched at the whole surface, heating the board by a hot plate and measuring the Barcol hardness when the surface of the substrate became 200°C. Wire bonding property was examined by preparing a printed wiring board having a pattern for evaluating wire bonding by using a both-surfaces copper-clad laminated board, and evaluating an adhesion ratio and adhesion strength in 100 wire bondings. The solder heat resistance was evaluated by maintaining the board in a pressure cooker tester for 2 hours, then immersing the board in a solder at a temperature of 260° C. for 20 seconds, and appearance was examined with naked eyes. The expression "OK" in the table means that there is no measling (peeling off of the resin accompanied by thermal strain at the overlapping portion of the weave pattern of the glass fiber) or blister. Migration resistance was measured by using through holes with a hole wall distance of 300 μm formed by using a drill having a diameter of 0.4 mmΦ to drill at a rotation number of 80,000 rpm and a feed rate of 3,200 mm/min and applying plating to the inside of the through holes with a thickness of about 20 μm, and a time until when breakage of continuity occurs at a temperature of 85° C., a relative humidity of 85%and an applied voltage of 100 V was measured. Incidentally, it was confirmed that all breakages of continuity occurred at CAF (conductive anodic filament) between through holes.

TABLE 1

|  | $R_{max}$ μm | Barcol hardness 200° C. | Wire bonding properties | | Solder heat resistance | Migration resistance |
| --- | --- | --- | --- | --- | --- | --- |
|  |  |  | Adhesion ratio (%) | Adhesive strength (g) |  |  |
| Example 1 | 5 | 38 | 100 | 12 to 16 | OK | >500 |
| Example 2 | 4 | 36 | 100 | 12 to 17 | OK | >500 |
| Example 3 | 4 | 37 | 100 | 12 to 18 | OK | >500 |
| Example 4 | 3 | 40 | 100 | 12 to 18 | OK | >500 |
| Example 5 | 4 | 39 | 100 | 12 to 16 | OK | >500 |
| Example 6 | 4 | 38 | 100 | 12 to 17 | OK | >500 |
| Example 7 | 3 | 43 | 100 | 14 to 18 | OK | >500 |
| Example 8 | 3 | 40 | 100 | 12 to 17 | OK | >500 |
| Example 9 | 3 | 45 | 100 | 14 to 18 | OK | >500 |
| Example 10 | 5 | 38 | 100 | 12 to 16 | OK | >500 |
| Example 11 | 4 | 39 | 100 | 12 to 18 | OK | >500 |
| Example 12 | 5 | 36 | 100 | 12 to 16 | OK | >500 |
| Example 13 | 5 | 37 | 100 | 12 to 17 | OK | >500 |
| Example 14 | 5 | 37 | 100 | 12 to 16 | OK | >500 |
| Comparative example 1 | 7 | 32 | 100 | 12 to 16 | NG | 156 |
| Comparative example 2 | 6 | 33 | 100 | 12 to 17 | NG | 288 |
| Comparative example 3 | 6 | 33 | 100 | 12 to 17 | NG | 216 |
| Comparative example 4 | 6 | 32 | 100 | 12 to 17 | NG | 360 |
| Comparative example 5 | 15 | 20 | 73 | 7 to 10 | OK | >500 |

From the results shown in Table 1, the following can be understood.

In the boards in Examples 1 to 14, there is no decrease in solder heat resistance or migration resistance, and they have surface roughness as small as 5 μm or less, and Barcol hardness at 200° C. was 30 or more.

Moreover, adhesion ratio at wire bonding at 200° C. was 100% (failure ratio of 0%) and its adhesion strength is sufficiently high, whereby excellent wire bonding properties are shown.

Industrial Applicability

A metal-clad laminated board obtained by using a prepreg according to the present invention and a printed wiring board using the same cause no decrease in solder heat resistance or migration resistance even when a large amount of an inorganic filler is added thereto, and have excellent surface smoothness and high surface hardness at high temperatures whereby excellent wire bonding properties are shown.

What is claimed is:

1. A prepreg which comprises a substrate and a resin composition containing a resin, an inorganic filler in an amount of 25% by volume based on the total volume of a solid component of the resin composition and a silicone polymer, which resin composition being impregnated into the substrate.

2. The prepreg according to claim 1, wherein the inorganic filler has previously been subjected to surface treatment by a silicone polymer.

3. The prepreg according to claim 2, wherein the resin composition further contains a coupling agent.

4. A metal-clad-laminated board which comprises at least one metal foil being laminated on both surfaces or one surface of the prepreg according to claim 1, or a laminated board thereof under heating and pressure.

5. The prepreg according to claim 2, wherein the resin composition is a resin composition in which a resin is formulated in a solution containing a silicone polymer into which the inorganic filler is dispersed.

6. The prepreg according to claim 2, wherein the resin composition is a resin composition in which a resin is formulated in a solution containing a silicone polymer into which the inorganic filler is dispersed, and a coupling agent.

7. The prepreg according to claim 2, wherein the silicone polymer is a three-dimensionally cross-linked polymer.

8. The prepreg according to claim 7, wherein the silicone polymer is a silicone polymer containing a least one of a tri-functional siloxane unit represented by the formula: $R^1SiO_{3/2}$ (wherein $R^1$ represents a same or different organic group) or a tetra-functional siloxane unit represented by the formula: $SiO_{4/2}$ in the molecule.

9. The prepreg according to claim 8, wherein the silicone polymer is a silicone polymer containing 15 to 100 mol % of at least one of a tetra-functional siloxane unit and a tri-functional siloxane unit in the molecule based on the total siloxane units, and 0 to 85 mol % of a bi-functional siloxane unit.

10. The prepreg according to claim 9, wherein the silicone polymer is a silicone polymer containing 15 to 100 mol % of a tetra-functional siloxane unit, 0 to 85 mol % of a tri-functional siloxane unit, and 0 to 85 mol % of a bi-functional siloxane unit in the molecule based on the total siloxane units.

11. A metal-clad-laminated board which comprises at least one metal foil being laminated on both surfaces or one surface of the prepreg according to claim 2, or a laminated board thereof under heating and pressure.

12. The metal-clad-laminated board according to claim 11, wherein a surface hardness of the metal-clad-laminated board at a portion containing no metal foil is 30 or more at 200° C. in terms of a Barcol hardness.

13. A printed wiring board which comprises the metal-clad-laminated board according to claim 11 obtained by subjecting the board to circuit processing.

14. A printed wiring board which comprises the metal-clad-laminated board according to claim 12 obtained by subjecting the board to circuit processing.

15. The prepreg according to claim 1, wherein the resin composition further contains a coupling agent.

16. The prepreg according to claim 1, wherein the inorganic filler has previously been subjected to surface treatment by a silicone polymer and a coupling agent.

17. The prepreg according to claim 1, wherein the resin composition is a resin composition in which a resin is formulated in a solution containing a silicone polymer into which the inorganic filler is dispersed.

18. The prepreg according to claim 1, wherein the resin composition is a resin composition in which a resin is formulated in a solution containing a silicone polymer into which the inorganic filler is dispersed, and a coupling agent.

19. The prepreg according to claim 1, wherein the silicone polymer is a three-dimensionally cross-linked polymer.

20. The prepreg according to claim 19, wherein the silicone polymer is a silicone polymer containing a least one of a tri-functional siloxane unit represented by the formula: $R^1SiO_{3/2}$ (wherein $R^1$ represents a same or different organic group) or a tetra-functional siloxane unit represented by the formula: $SiO_{4/2}$ in the molecule.

21. The prepreg according to claim 20, wherein the silicone polymer is a silicone polymer containing 15 to 100 mol % of at least one of a tetra-functional siloxane unit and a tri-functional siloxane unit in the molecule based on the total siloxane units, and 0 to 85 mol % of a bi-functional siloxane unit.

22. The prepreg according to claim 21, wherein the silicone polymer is a silicone polymer containing 15 to 100 mol % of a tetra-functional siloxane unit, 0 to 85 mol % of a tri-functional siloxane unit, and 0 to 85 mol % of a bi-functional siloxane unit in the molecule based on the total siloxane units.

23. The metal-clad-laminated board according to claim 4, wherein a surface hardness of the metal-clad-laminated board at a portion containing no metal foil is 30 or more at 200° C. in terms of a Barcol hardness.

24. A printed wiring board which comprises the metal-clad-laminated board according to claim 4 obtained by subjecting the board to circuit processing.

25. A printed wiring board which comprises the metal-clad-laminated board according to claim 23 obtained by subjecting the board to circuit processing.

* * * * *